(12) United States Patent
Kim

(10) Patent No.: US 7,053,417 B2
(45) Date of Patent: May 30, 2006

(54) SEMICONDUCTOR LED DEVICE AND PRODUCING METHOD

(75) Inventor: Chang-Tae Kim, Sungnam-Si (KR)

(73) Assignees: Epivalley Co., Ltd., Gyounggi-do (KR); Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/363,432

(22) PCT Filed: Sep. 4, 2001

(86) PCT No.: PCT/KR01/01494

§ 371 (c)(1),
(2), (4) Date: Feb. 28, 2003

(87) PCT Pub. No.: WO02/21605

PCT Pub. Date: Mar. 14, 2002

(65) Prior Publication Data

US 2004/0007786 A1   Jan. 15, 2004

(30) Foreign Application Priority Data

Sep. 4, 2000   (KR) .............................. 2000/52169

(51) Int. Cl.
*H01L 33/00* (2006.01)
(52) U.S. Cl. .......................... 257/94; 257/103; 438/94
(58) Field of Classification Search .................. 257/94
See application file for complete search history.

(56) References Cited

U.S. PATENT DOCUMENTS

| | | | | |
|---|---|---|---|---|
| 4,448,633 A | * | 5/1984 | Shuskus | 438/767 |
| 5,719,433 A | * | 2/1998 | Delage et al. | 257/625 |
| 5,777,350 A | | 7/1998 | Nakamura et al. | |
| 5,959,307 A | * | 9/1999 | Nakamura et al. | 257/14 |
| 6,020,602 A | * | 2/2000 | Sugawara et al. | 257/103 |
| 6,093,952 A | * | 7/2000 | Bandic et al. | 257/485 |
| 6,812,152 B1 | * | 11/2004 | Lindstrom et al. | 438/706 |

FOREIGN PATENT DOCUMENTS

| | | |
|---|---|---|
| JP | 9-129919 A | 5/1997 |
| JP | 9-129921 A | 5/1997 |
| JP | 9-307141 A | 11/1997 |
| JP | 10-056206 A | 2/1998 |

* cited by examiner

*Primary Examiner*—Jerome Jackson
(74) *Attorney, Agent, or Firm*—Blackwell Sanders Peper Martin, LLP

(57) ABSTRACT

The present invention provides a semiconductor device with InxGa1-xN crystal passivation layer and manufacturing method thereof which effectively blocks the leakage current between the surface & boundary of a device and a pn-junction boundary, and enhances the light emission efficiency as forming new structural semiconductor devices by removing the conventional dielectric passivation layer and using InxGa1-xN crystal layer instead.

A semiconductor device with gallium nitride type crystal passivation layer, wherein said semiconductor device has a p-n junction diode construction and forms a InxGa1-xN crystal passivation layer with a specified thickness and a width around the edge of the upper surface of p-GaN layer which is the top layer of the semiconductor device.

9 Claims, 7 Drawing Sheets

SEMICONDUCTOR LED DEVICE AND PRODUCING METHOD

TECHNICAL FIELD

The present invention is related to a semiconductor device and a manufacturing method thereof. More particularly, the invention relates to a semiconductor device and a manufacturing method thereof with gallium nitride based crystal passivation layer and a manufacturing method thereof which improves the effectiveness for blocking leakage current and thermal emission efficiency by using an InxGa1-xN crystal body instead of the conventional dielectric passivation layer.

BACKGROUND ART

As shown in FIG. 1, a GaN based Light Emitting Diode (LED) generally comprises a buffer layer 11 on a sapphire substrate 10, an n-type GaN layer 12, an InGaN (or GaN) active layer 13, a p-type GaN layer 14, a transparent electrode 15, a dielectric passivation layer 16, an n-based metal electrode 17 and a p-type metal electrode 18. The method of forming a GaN based Light Emitting Diode (LED) comprises the steps of successively crystal growing of the buffer layer 11 on the sapphire substrate 10, the n-type GaN layer 12, the InGaN 9 (or GaN) active layer 13, and the p-type GaN layer 14 according to the Metal Organic Chemical Vapor Deposition (MOCVD) method; partly etching up to the n-type GaN layer 12 in order to form the n-type metal electrode 17; forming the transparent electrode 15; coating the surface with the dielectric passivation layer 16 except the electrode region; and depositing the n-type metal electrode 17 and the p-type metal electrode 18.

FIG. 2 is a cross-section diagram which illustrates the principle of leakage current occurrence for a GaN based optical semiconductor device in the absence of a dielectric passivation layer.

As shown in FIG. 2, the leakage current flows through the surfaces and boundaries when a voltage is applied to the electrode terminals and has significant effects on the performance of the device and sometimes causes destruction of the device.

For the case of GaN based semiconductor devices, boundaries for electrode deposition of a device are formed by Reactive Ion Etching (RIE). At this instance, the boundaries are damaged due to high energy ion bombardments and leakage current occurs along the damaged boundaries. Also, during the breaking or sawing of a device into individual chips after the completion of the process, too much stress exists on the cleavage boundary of the crystal growth layer and generally the boundaries become very rough due to the cleave not coinciding with the crystal faces. A large amount of leakage current flows along these rough boundaries.

Accordingly, at the conventional GaN based semiconductor, as shown on FIG. 1, the leakage current is prevented by coating the surface between the p metal electrode 18 and the n-type GaN 12 layer with the dielectric passivation layer 16.

The dielectric passivation layer 16 cuts off the passage of the leakage current that flows on the boundaries through the semiconductor surface and protects the surface of the device from external damages. This is an essential process in order to protect the device from surface damages and also secure the reliability of the device as well as improving the assembly yield. This process is also a final stage process which requires an extreme caution.

According to a construction method of the conventional dielectric passivation layer, a dielectric passivation layer such as $SiO_2$ or $Si_3N_4$ is deposited using the PECVD or Sputtering process after forming a transparent electrode and the n-type & p-type metal electrodes. In this case, generally plasma is used for the deposition instead of a simple CVD method or thermal deposition method each of which has a weak adhesion strength between the dielectric passivation layer and the semiconductor surface. The plasma deposition method can improve the adhesion among the dielectric passivation layer, the metal surface (transparent electrode) and the semiconductor surface.

However, the deposition of a dielectric passivation layer under a plasma environment might cause damage on the performance of the device since RF power and DC bias, which are necessary for formation of plasma, are directly applied to the surface of the semiconductor. Sometimes this damage on the performance of the device might cause an eventual failure of the whole semiconductor process or a remarkable drop of the performance of the device.

Also, since the dielectric passivation layer deposition process is the final process of the device manufacturing, the total yield and performance of the device can be significantly affected by a small process variable. If an optical semiconductor device is to be operated at a high output mode due to high voltage and high current, the light emission efficiency of the device is lowered due to the thermal resistance characteristic (very low thermal resistance) of the dielectric which reduces the amount of thermal emission generated by the InGaN active layer 13.

Especially, in case of the junction-side down method which bonds a metal frame (or submount 19) with the upper face of the device for thermal emission as shown in FIG. 3, an inconsistent device, where the dielectric passivation layer 16 blocks is between the semiconductor device and the metal frame 19, is constructed.

Also, the amount of leakage current on the p-n diode junction boundary is not negligible and this significantly affects the reliability of the device. It is difficult to sufficiently recognize the leakage current at the initial stage since it affects device yield after assembling and a long term reliability. Hence, it is required to fundamentally block the leakage current between the p-type metal electrode and the n-type GaN layer.

DETAILED DESCRIPTION OF THE INVENTION

The present invention is designed to overcome the above problems of prior art. The object of the invention is to provide a new structural semiconductor device which effectively blocks the leakage current in the surface & boundary of the device and in the pn-junction boundary, and enhances the light emission efficiency by removing the conventional dielectric passivation layer accompanying several problems and using an InxGa1-xN crystal layer instead. Namely, the GaN based optical semiconductor device with a pn junction diode structure comprising an n-type electrodes, a transparent electrode and p-type electrodes according to the present invention is constructed first by sequentially forming a buffer layer on a substrate, an n-type GaN layer, an InGaN/GaN active layer, a p-type GaN layer and an n-type InxGa1-xN crystal layer, afterwards forming an n-type InxGa1-xN ($0 \leq x \leq 1$) crystal passivation layer with a specified thickness (t) and a width (w) only around the edge of the upper surface of the p-type GaN layer. The n-type InxGa1-xN ($0 \leq x \leq 1$) crystal passivation layer is grown with a thickness around $0.1 \, nm \leq t < 5{,}000 \, nm$. The value of n-doping concentration is $10^{15}/cm^3 < n < 10^{22}/cm^3$ and the width is $0.1 \, \mu m < w < 300 \, \mu m$.

The present invention is to provide a semiconductor device and a manufacturing method thereof with gallium nitride (GaN) based crystal passivation layer having a new structural semiconductor in order to be used as a leakage current block and a device passivation layer, by using an InxGa1-xN crystal body which is deposited at the initial crystal formation stage of the device instead of the conventional dielectric passivation layer which is deposited at the final process of the device.

DESCRIPTION OF THE NUMERIC ON THE MAIN PARTS OF THE DRAWINGS 10, 40: Substrate
11, 41: Buffer Layer
12, 42: n-type GaN Layer
13, 43: InGaN (or Gan) Active Layer
14, 44: p-type GaN Layer
15, 46: Transparent Electrode
16: Dielectric Passivation Layer
17, 47: n-type Metal Electrode
18, 48: p-type Metal Electrode
45-a: InxGa1-xN Crystal Layer
45: InxGa1-xN Crystal Passivation Layer

BEST MODE FOR CARRYING OUT THE INVENTION

In order to achieve the stated object, a semiconductor device which forms the gallium nitride based crystal passivation layer according to the present invention provides a GaN based type semiconductor device with a p-n junction diode structure comprises an InxGa1-xN crystal layer with a specified thickness and a width as a pssivation layer on the top edge region of a p-type GaN layer which is at the uppermost layer of the semiconductor device.

Hereinafter, preferred embodiments of the present invention will be described in detail with reference to the accompanying drawings.

Figure 1:
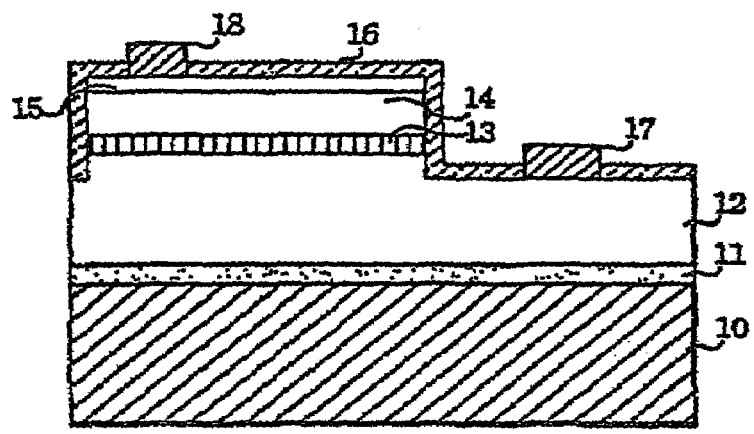
FIG. 1 is a cross section diagram which shows the structure of a conventional GaN based optical semiconductor device.
Figure 2:
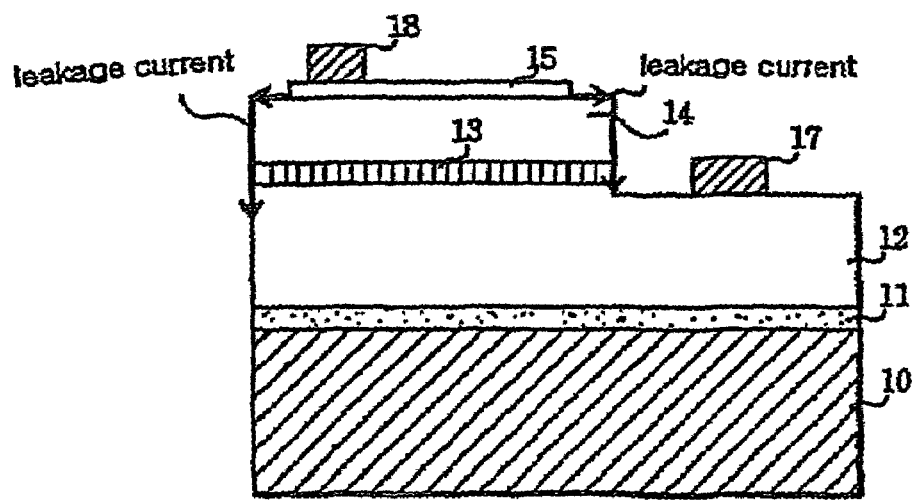
FIG. 2 is a cross-section diagram which illustrates the principle of leakage current occurrence for the GaN based optical semiconductor device.
Figure 3:
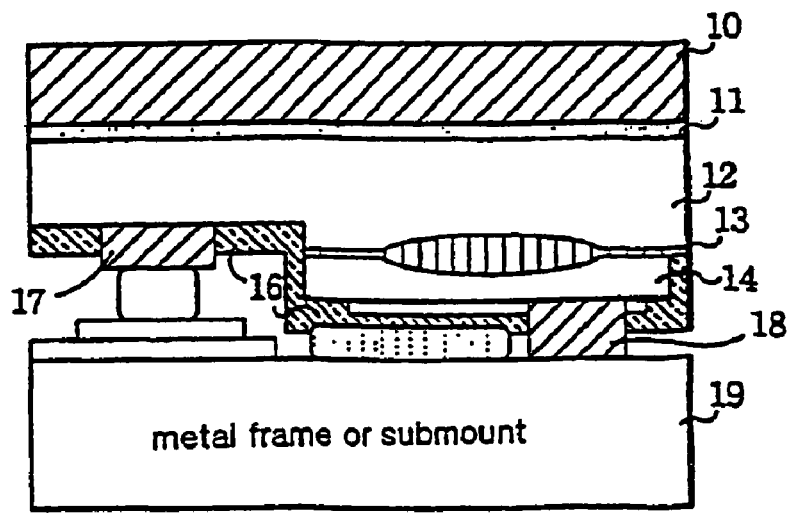
FIG. 3 is a cross section diagram which shows a junction-side down type assembly structure for a high output operation of the conventional GaN based optical semiconductor device.
Figure 4:
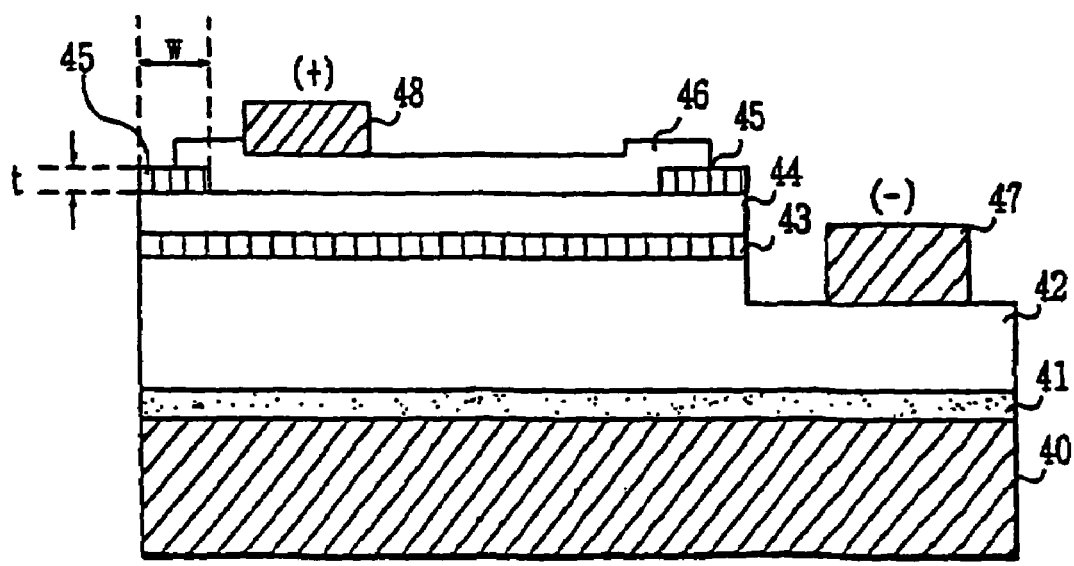
FIG. 4 is a cross section diagram which shows an embodiment of the construction of optical semiconductor device with an n-type InxGa1-xN crystal passivation layer according to the present invention.

FIG. 4 shows an embodiment of the construction of an optical semiconductor device with an InxGa1-xN crystal passivation layer according to the present invention.

As shown in FIG. 4, the GaN based optical semiconductor device with a pn junction diode structure comprising an n-type electrodes 47, a transparent electrode 46 and p-type electrodes 48 according to the present invention is constructed by sequentially forming a buffer layer 41 on a substrate 40, an n-type GaN layer 42, an InGaN/GaN active layer 43, a p-type GaN layer 44 and an n-type InxGa1-xN crystal layer 45-$a$, afterwards forming an n-type InxGa1-xN ($0 \leq x \leq 1$) crystal passivation layer 45 with a specified thickness (t) and a width (w) only around the edge of the upper surface of the p-type GaN layer 44.

The n-type InxGa1-xN($0 \leq x \leq 1$) crystal passivation layer 45 is grown with a thickness around $0.1 \text{ nm} \leq t < 5{,}000 \text{ nm}$. The value of n-doping concentration is $10^{15}/\text{cm}^3 < n < 10^{22}/\text{cm}^3$ and the width is $0.1 \text{ }\mu\text{m} < w < 300 \text{ }\mu\text{m}$.

The present invention is to provide a semiconductor device and a manufacturing method thereof with gallium nitride (GaN) based crystal passivation layer having a new structural semiconductor in order to be used as a leakage current block and a device passivation layer, by using the InxGa1-xN crystal body 45 which is deposited at the initial crystal formation stage of the device instead of the conventional dielectric passivation layer 16 which is deposited at the final process of the device.

Hence, it is effective for cutting off the leakage current and is able to solve many problems that come with depositing a dielectric passivation layer at the final stage.

Figure 5A:
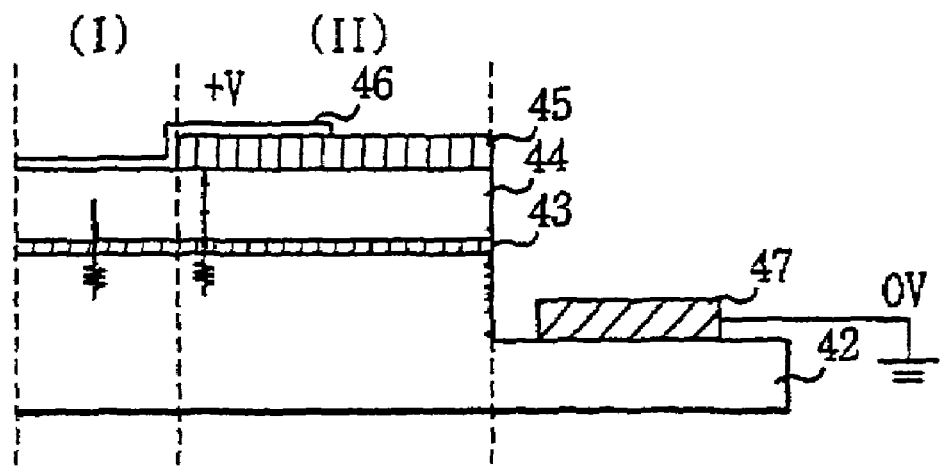
FIGS. 5a and 5b are cross-section diagrams of the main parts which illustrate the principle of cutting off the leakage current and pinch-off phenomenon for the optical semiconductor device according to the present invention.
Figure 5B:
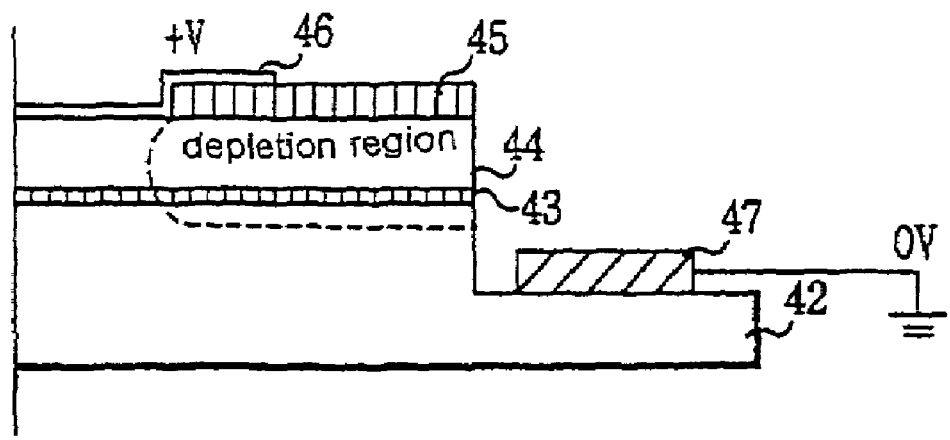

FIGS. 5a and 5b illustrate the principle of cutting off the leakage current for the optical semiconductor device according to the present invention.

As shown in FIG. 5a, if a voltage (+V) is applied, the device center region (region (I)), where the n-type InxGa1-xN passivation layer 45 is not formed, becomes a p-n junction diode structure operating normally, however, the edge of the device surface region (region (II)), where the n-type InxGa1-xN passivation layer 45 is formed, becomes an n-p-n junction diode structure with n-InxGa1-xN/p-GaN/n-InxGa1-xN and no current flows.

Also, as shown in FIG. 5b, if a voltage (+V) is applied to a part on the top n-type InxGa1-xN passivation layer 45, it takes an n-InxGa1-xN/p-GaN/n-InGaN/n-GaN structure and becomes a reverse directional n-p-n junction. Also, a depletion region forms in the junction of the p-type GaN layer 44 due to the influence of the n-type layers with high doping concentration at the top and the bottom, and thus a pinch-off phenomenon occurs wherein no hole current flows in the horizontal direction of the p-type GaN layer 44 hence the leakage current in the horizontal direction can be completely blocked.

Also, since the interface section between the p-type GaN layer 44 and the n-type InxGa1-xN passivation layer 45 has a complete crystal structure such as a single crystal, the leakage current can more completely be blocked in comparison to the conventional dielectric passivation layer deposition.

Especially, in comparison to the dielectric passivation layer 16, the n-type InxGa1-xN passivation layer 45 has a much better heat transfer characteristic and is a good quality crystal layer which is identical to the construction layer of the device, hence, the n-type InxGa1-xN passivation layer 45 is a very effective structure for thermal emission for the junction-side down type.

Figure 6A:
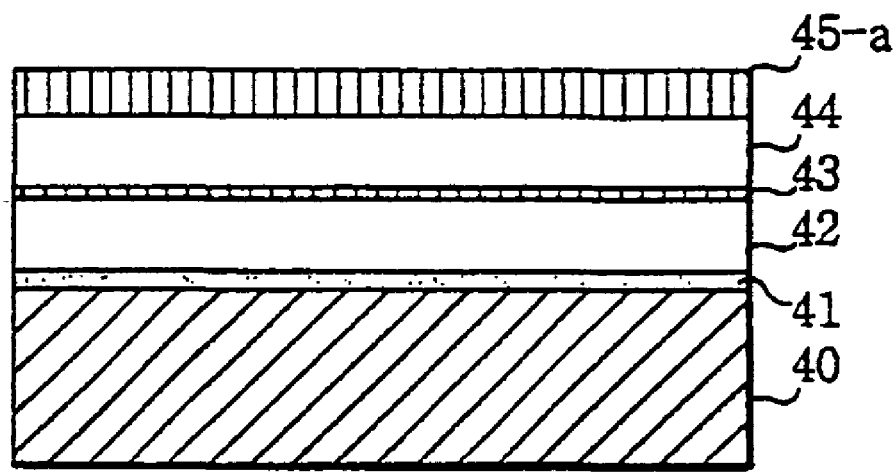
FIG. 6a to FIG. 6e are cross section diagrams which illustrate the manufacturing process of the optical semiconductor device with an n-type InxGa1-xN crystal passivation layer according to the present invention.

FIG. 6a to FIG. 6e are cross section diagrams which illustrate the manufacturing process of the optical semiconductor device with an n-type InxGa1-xN crystal passivation layer according to the present invention. As shown in FIG. 6a, the manufacturing method of the optical semiconductor device with an n-type InxGa1-xN crystal passivation layer according to the present invention comprises the steps of successively crystal growing of a buffer layer 41 on a substrate (sapphire, SiC, GaN, Si, etc) 40, an n-type GaN layer 42, an InGaN/GaN active layer 43, a p-type GaN layer 44 and a n-type InxGa1-xN crystal layer 45-a according to the Metal Organic Chemical Vapor Deposition (MOCVD) method.

As a carrier gas for growing the MOCVD crystal, high purity hydrogen gas (H2) or nitrogen gas (N2) can be used. Especially, in case of growing n-type InxGa1-xN crystal, the n-type InxGa1-xN crystal quality can be improved by growing in a N2 gas environment which has a heavier mass value than H2.

Figure 6B:
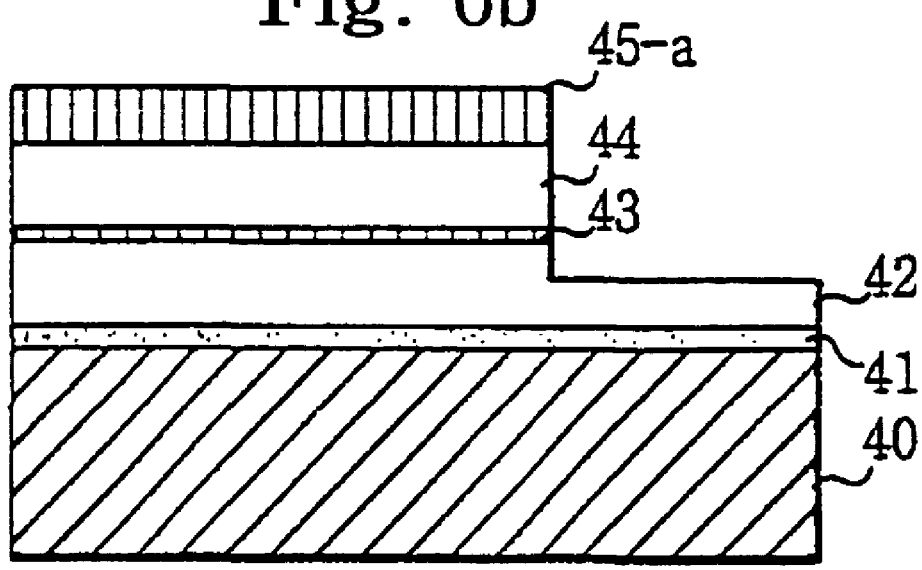

Next, as shown in FIG. 6b, in order to form an n-type electrode 47, the upper right end section of the device is etched down to the n-type GaN layer 42.

Figure 6C:
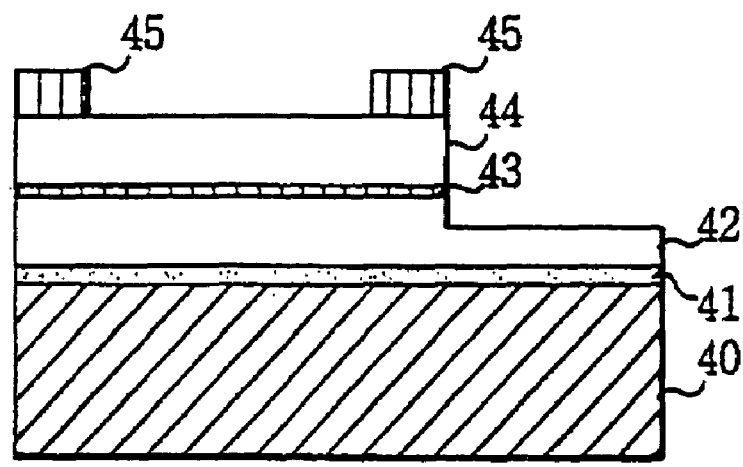

Also, after the above process, an n-type InxGa1-xN passivation layer is formed by removing the whole n-InxGa1-xN crystal layer 45-a by an a etching process except the specified region defined by the passivation layer of the device (around the edge of device surface)(see FIG. 6c). In this way, the n-type InxGa1-xN passivation layer 45 forms around the top edge of the p-type GaN layer 44 in the form of a square band.

At this instance, for the etching of the n-type InxGa1-xN crystal layer 45-a, RIE etching method, chemical etching, or photo electrochemical etching method can be used.

Among the etching methods listed above, the chemical etching method is most advantageous since it can minimize the damages on the device surface. Specifically, the photo electro chemical etching method is the most suitable method for the present invention because it is capable of selectively etching the n-type InxGa1-xN crystal layer 45-a without etching the p-type GaN layer 44.

Figure 7:
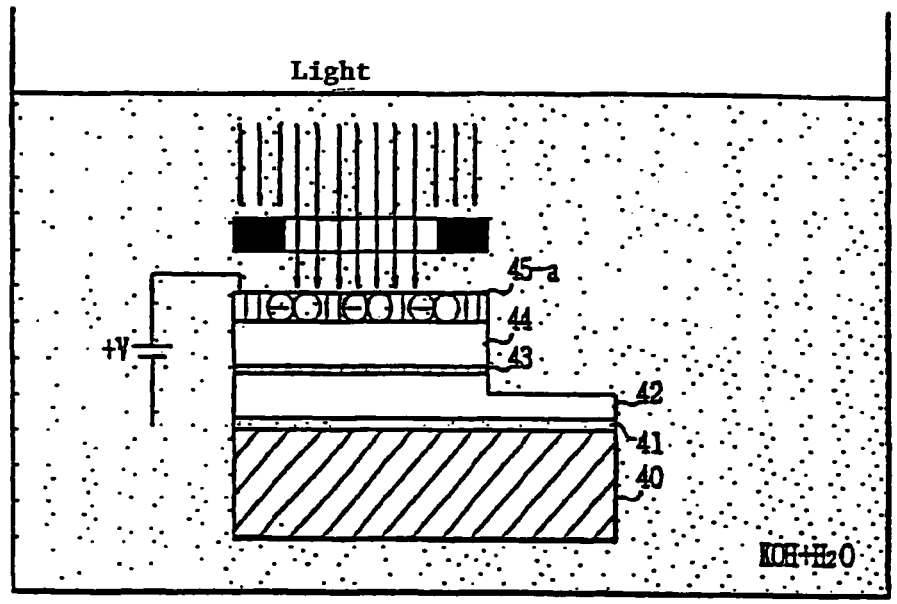
FIG. 7 is a cross section diagram which shows the principle of the photo electrochemical etching method adopted by the present invention.

FIG. 7 is a cross section diagram which illustrates the principle of the photo electro chemical etching method adopted by the present invention.

As shown in FIG. 7, the standard photo electro chemical etching method generates electrons and holes by exposing the subjected etching part to a light with a bigger energy value than the band gap of the n-type InxGa1-xN crystal layer 45-a and reacts with a electrolytic solution (KOH+ $H_2O$) in order to etch rapidly the hole generated part.

Also, according to the polarity of voltage applied to the electrolytic solution and the crystal layer, either n-type layer or p-type layer can be selectively etched.

Accordingly, by selecting the polarity of voltage and exposing the subjected etching part to a light, only the n-type In(x)Ga(1-x)N crystal layer 45-a can be selectively etched against the p-type GaN layer 44 and the etched semiconductor surface can remain in very good state without any damage or stress.

Figure 6D:
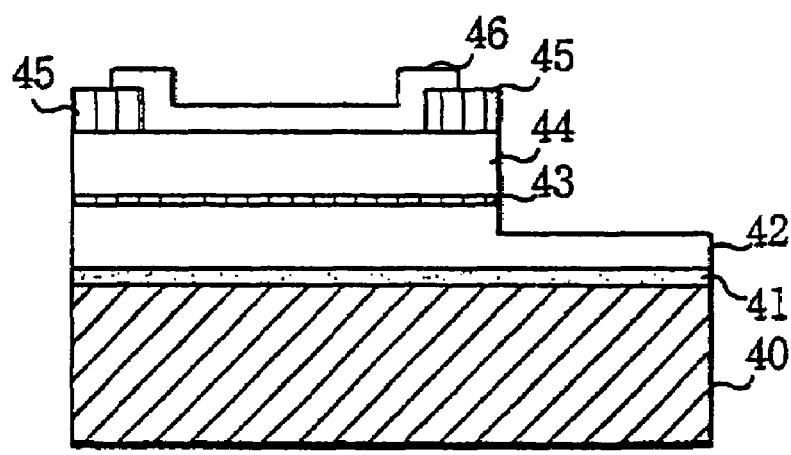
Figure 6E:
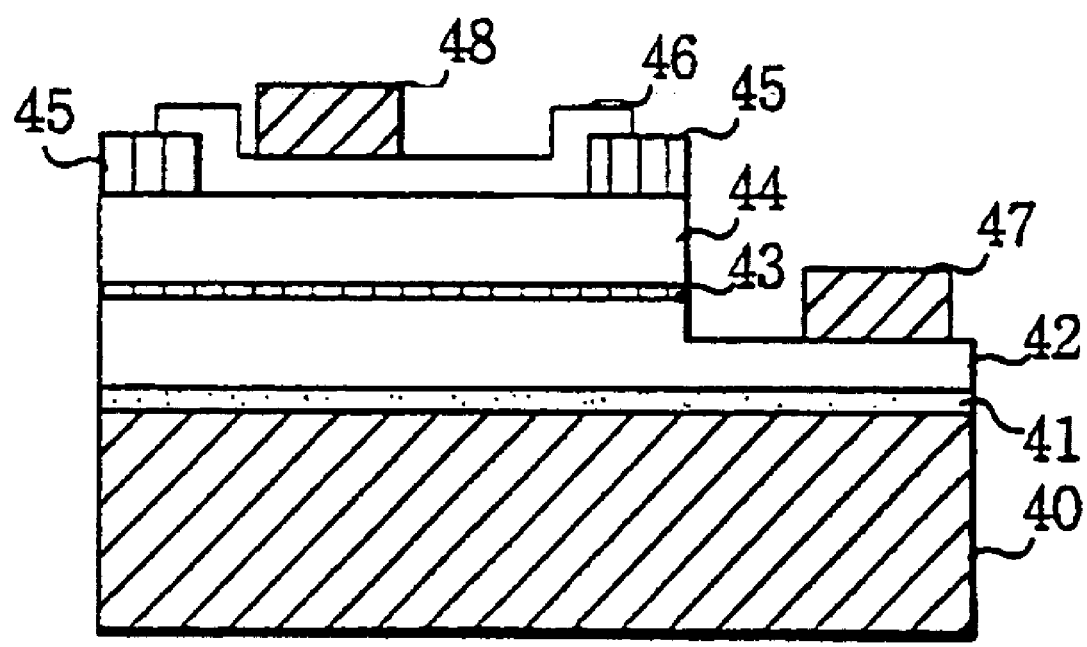

Also, as shown in FIG. 6d, if necessary, the manufacturing process of the optical semiconductor device according to the present invention is completed by depositing a transparent electrode 46 or front face electrode on the upper section of the n-type InxGa1-xN passivation layer 45 and the p-type GaN layer 44 and forming an n-type metal electrode 47 and a p-type metal electrode 48 as shown in FIG. 6e.

If necessary, the n-type In(x)Ga(1-x)N crystal layer 45-a on the p-type GaN layer 44 can form a passivation layer 45 as an insulator which does not conduct electricity by intentionally dropping or undergoing a slight p-type doping.

Figure 8:
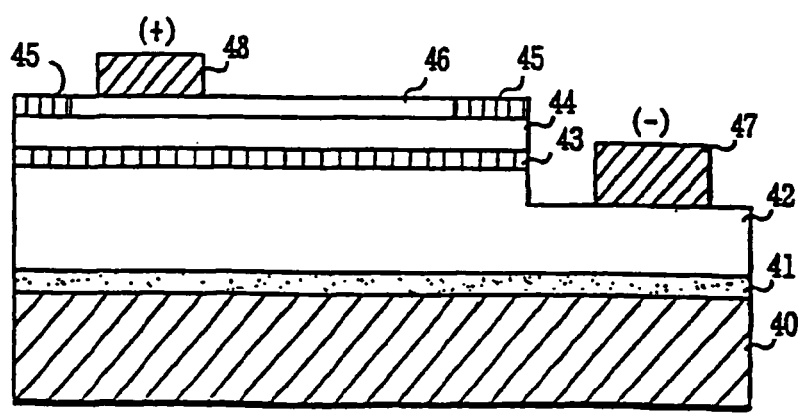
FIG. 8 is a cross section diagram which shows other embodiment of the construction of optical-semiconductor-device with an n-type InxGa1-xN crystal passivation layer according to the present invention.

FIG. 8 is a cross section diagram which shows another embodiment of the construction of the optical semiconductor device with the n-type InxGa1-xN crystal passivation layer according to the present invention.

As shown in FIG. 8, the optical semiconductor device can be constructed in the form where the p-type electrode 48 is not applied to the n-type InxGa1-xN passivation layer 45 by covering only on the p-GaN layer 44.

It should be understood, however, that the detailed description and specific examples are given by way of illustration only, since various changes and modifications within the spirit and scope of the invention will become apparent to those skilled in the art from this detailed description.

INDUSTRIAL APPLICABILITY

According to the present invention constructed as explained so far, by forming an InxGa1-xN on the top surface edge region of a p-type GaN layer during crystal growing stage, leakage current from the surface of the device to the boundary of the device can completely be blocked of the device and due to n-p-n type junction structure the pinch-off phenomenon is occurred on the cleavage boundary of the p-type GaN layer hence the reliability and the yield of the device can be improved very greatly.

Also, the InxGa1-xN passivation layer of the present invention has a very excellent thermal conductibility, hence, to be operated at a high output mode the light emission efficiency and reliability of the device can be improved.

Also, due to the n-type InxGa1-xN passivation layer of the present invention being formed at the initial crystal formation stage of the device, the conventional dielectric deposition process which is performed at the final process of the device is omitted, hence the simplification of the process and the yield of the device can be improved very greatly.

What is claimed is:

1. A semiconductor device with gallium nitride based crystal passivation layer, wherein said semiconductor device has a p-n junction diode construction and forms an InxGa1-xN (0≦x<1) crystal layer with a specified thickness and a width around the edge of the upper surface of a p-type GaN layer which is the top layer of said semiconductor device as a passivation layer, and wherein said InxGa1-xN (0≦x<1) crystal passivation layer has a value of p-doping concentration substantially less than that of said p-type GaN layer when said InxGa1-xN (0≦x<1) crystal passivation layer is p-type doped.

2. The semiconductor device as claimed in claim 1, wherein said InxGa1-xN (0≦x<1) crystal passivation layer is formed with a thickness around 0.1 nm–5,000 nm and a width around 0.1 μm–300 μm surrounding the edge of the upper surface of said p-type GaN layer.

3. The semiconductor device as claimed in claim 1, wherein an electrode face is not covered on the upper section of said InxGa1-xN (0≦x<1) crystal passivation layer.

4. A manufacturing method for a semiconductor device with gallium nitride based crystal passivation layer comprising the steps of:

growing an InxGa1-xN ($0 \leq x<1$) crystal passivation layer on the surface of a p-type GaN layer which is the top layer of said semiconductor device, and forming said InxGa1-xN ($0 \leq x<1$) crystal passivation layer around the edge of the upper surface of said p-type GaN layer by removing the center section of said InxGa1-xN ($0 \leq x<1$) crystal passivation layer through an etching process, wherein said InxGa1-xN ($0 \leq x<1$) crystal passivation layer has a value of p-doping concentration substantially less than that of said p-type GaN layer when said InxGa1-xN ($0 \leq x<1$) crystal passivation layer is p-type doped.

5. The method as claimed in claim 4, wherein said InxGa1-xN ($0 \leq x<1$) crystal passivation layer is grown in a N2 gas environment according to the MOCVD crystal growing method.

6. The method as claimed in claim 4, wherein said InxGa1-xN ($0 \leq x<1$) crystal passivation layer is formed by selecting any one of the etching method among the RIE etching, chemical etching, or photo electrochemical etching methods.

7. The method as claimed in claim 4, wherein said InxGa1-xN($0 \leq x<1$) crystal passivation layer is formed with a thickness around 0.1 nm–5,000 nm and a width around 0.1 m–300m surrounding the edge of the upper surface of said p-type GaN layer.

8. A semiconductor device with gallium nitride based crystal passivation layer, wherein said semiconductor device has a p-n junction construction and forms an n-type InxGa1-xN ($0<x<1$) crystal layer with a specific thickness and a width surrounding the edge of the upper surface of a p-type GaN layer which is the top layer of said semiconductor device as a passivation layer.

9. A semiconductor device with gallium nitride based crystal passivation layer, wherein said semiconductor device has a p-n junction construction and forms an n-type GaN crystal layer with a specified thickness and a width surrounding the edge of the upper surface of a p-type GaN layer which is the top layer of said semiconductor device as a passivation layer.

* * * * *